BINARY-PULSE COUNTER HAVING MINIMIZED CUMULATIVE STAGE SWITCHING DELAY

Filed May 14, 1965

INVENTOR.
SETH J. R. LUNDIN
BY
Frank R. [signature]
AGENT

INVENTOR.
SETH J. R. LUNDIN
BY
Frank R. Trifari
AGENT

United States Patent Office 3,422,254
Patented Jan. 14, 1969

3,422,254
BINARY PULSE COUNTER HAVING MINIMIZED CUMULATIVE STAGE SWITCHING DELAY

Seth Johan Ronald Lundin, Vallingby, Sweden, assignor to North American Philips Company, Inc., New York, N.Y., a corporation of Delaware Filed May 14, 1965, Ser. No. 455,751
Claims priority, application Sweden, May 21, 1964, 6,182/64
U.S. Cl. 235—92 4 Claims
Int. Cl. G06f 7/38; G06g 7/00

ABSTRACT OF THE DISCLOSURE

A binary pulse counter arrangement for reduced intra stage delay is provided with a plurality of AND gates each arranged in the input of each stage of the counter but the first. Each gate but the first is responsive to the output of the preceding gate, the preceding stage and the signal input. Each gate receives no more than three inputs, regardless of the number of states.

Figure 1:
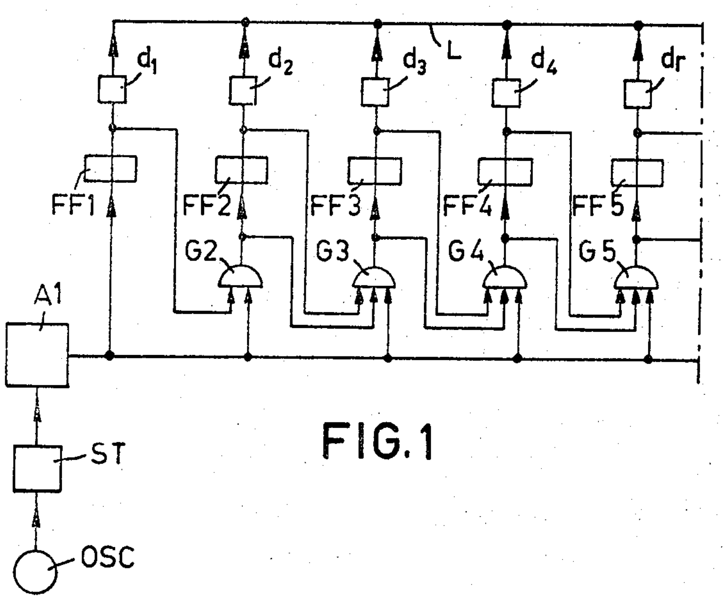

The present invention relates to an arrangement for triggering a binary pulse counter consisting of a number of bistable stages or flip-flops. Triggering takes place such that the stage being switched is switched from a reset position. The switched stage is preceded by pre-switched stages which are reset at the same time. The switched and reset positions can according to common terminology be called position 1 and 0 respectively. The invention refers in particular to a binary pulse counter used as pulse generator in that pulses are derived from the individual stages when the respective stage is switched to position 1 from the reset position 0. It is known that pulses so derived from the different stages will theoretically not coincide in time no matter how many stages the counter contains and therefore any required accurately determined pulse mean frequency can be achieved only by combining the derived pulses from selected ones of the stages. However, when pulses are to be interleaved with each other very high requirements are placed upon the control of the counter with respect to the moment of triggering. It is to be understood that the maximum delay in triggering action for any of the stages must be appreciably lower than the shortest pulse interval, i.e. the interval between the pulses derived from the first stage, which operates at the highest speed. For achieving high resolution at the frequency setting in such pulse generators it is also necessary to use a high driving frequency and a large number of stages in the counter. The frequency will be limited by the operation time of the first stage in the counter which has to operate at the highest speed. However, if special measures were not taken the speed would be further limited by the maximum delay requirement in that triggering action must be less than the shortest pulse, interval. If for example, small time delays were allowed to accumulate from stage to stage this would in combination with the large number of stages used, for example of the order 30, result in a total delay of triggering of the last stage such that the maximum driving speed would be seriously affected.

In order to determine the triggering moment more accurately it has previously been proposed to trigger each stage through an AND-gate which is connected to all foregoing stages which act to open the gate at the correct moments. This arrangement is disadvantageous in that the complexity of the gates will increase with the number of stages in the counter. Furthermore, the number of inputs a gate can handle is limited and therefore in case of a counter having a very large number of stages a complicated gating arrangement comprising a number of gate for each one of the last stages in the counter would be necessary. For overcoming this difficulty it has been proposed to control each AND-gate from the output of the preceding foregoing stage and the preceding AND-gate. This will result in correct control of the counter but the small delays of the AND-gates will accumulate so that the triggering of a stage will be delayed an amount which is equal of the sum of the delays in all the foregoing AND-gates.

The invention has for its purpose to eliminate these drawbacks and to produce a triggering arrangement which is simple and in which the delays are reduced to an extent such that the counter, when used as a pulse generator, can be operated at a speed corresponding to its maximum capacity.

The invention is based upon recognition of the fact that if a triggering waveform of rectangular shape is used, the voltage level in this waveform preceding the triggering flank could be used as a further input voltage to the triggering AND-gates, thereby eleminating accumulating effects of the delays.

The invention thus refers to an arrangement for triggering a binary pulse counter from the output of a triggering pulse generator which delivers two voltage levels defining a substantially rectangular output voltage, the stepwise voltage change from a first voltage level to a second voltage level defining a flank in the rectangular voltage being used for initiating triggering action. Each stage output delivers a characteristic voltage in switched position and each stage of the counter but the first is associated with an AND-gate having its output connected to a trigger input of the stage. The AND-gate delivers two different voltage levels to the stage in accordance with the nonfulfilment or fulfilment of the AND-condition of the gate, the stage being triggered by a stepwise voltage change at the output of the gate arising due to disappearance of the AND-condition. The AND-gate has one input connected to the triggering generator, one input connected to the output from the preceding or foregoing stage and for all gates except the first one, one input connected to the output of the foregoing AND-gate. The AND-condition for an AND-gate is fulfilled only if the gate receives the first voltage level from the triggering pulse generator, the characteristic voltage from the output of the foregoing stage and a voltage level from the output of the foregoing gate indicating that the corresponding AND-condition is fulfilled for the foregoing gate. When the AND-condition of a gate is fulfilled, the next trigger flank from the triggering generator will cause triggering of the associated stage. The voltages received from the foregoing stage and the foregoing gate will then determine if triggering is to take place or not, while the voltage from the triggering generator will determine the triggering moment as the flank in this voltage is not delayed at all and therefore comes first in time. Thus, the delay of the triggering of any stage will only amount to the sum of the delays occurring in the particular gate and stage triggered.

The delay of the gate can furthermore be substantially eliminated in that according to another feature of the invention the gate is by-passed by a diode from the output of the gate to the triggering pulse-generator. By this is meant that the current necessary for triggering the stage will not be drawn through the gate but instead directly from the triggering generator through the by-passing diode.

Figure 2:
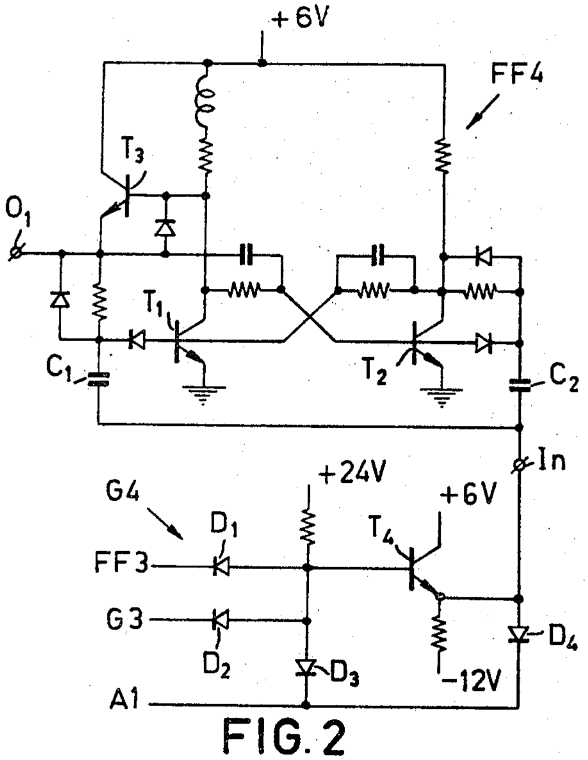
Figure 3:
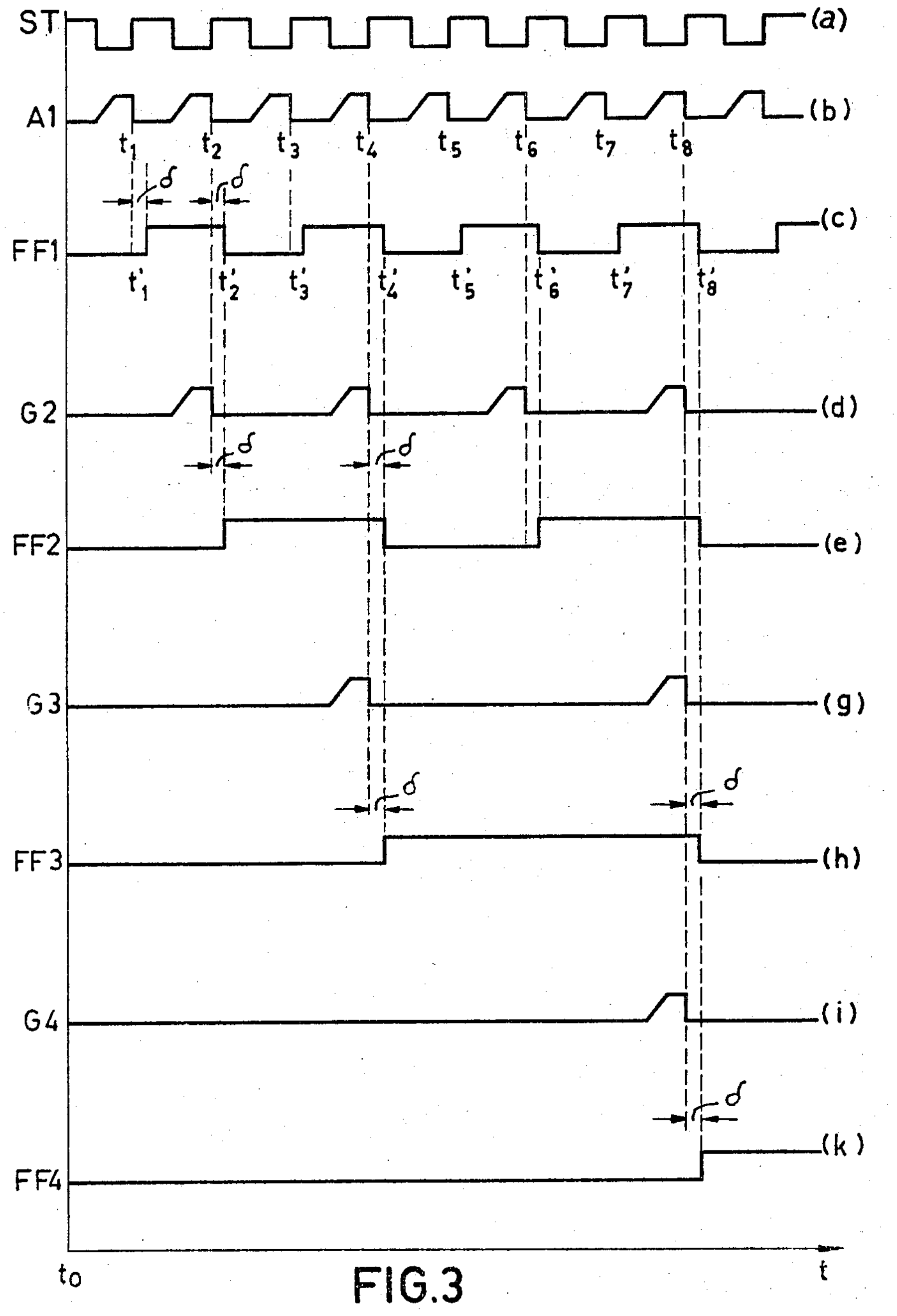

The invention is now explained more fully in connection with the accompanying drawings, in which FIG. 1 shows a block diagram of a binary pulse counter with a triggering arrangement according to the invention, FIG. 2 shows a detailed circuit diagram of a suitable embodiment of a bistable stage or flip-flop in the counter with associated AND-gate and FIG. 3 shows some time diagrams for illustrating the triggering function.

According to FIG. 1 a binary pulse counter consisting of a number of bistable stages or flip-flops FF1, FF2, FF3 . . . is triggered from the output of a triggering amplifier A1 through AND-gates G2, G3, G4 . . . associated with each stage except the first one which is triggered directly from the output of the amplifier A1. The triggering amplifier is driven from an oscillator OSC via a Schmitt-trigger stage ST for producing a rectangular input voltage for the amplifier. The gates have one input connected to the triggering amplifier A1 and one input connected to the output of the foregoing stage and furthermore for all gates except the first one (G2) one input connected to the output of the foregoing gate.

The gates deliver a voltage at their output only if input voltages are present at all inputs and triggering is initiated by a voltage jump at the output of the AND-gate corresponding to disappearance of the AND-condition. The AND-condition is fulfilled when the gate receives from the triggering amplifier a voltage level preceding the triggering flank and a further voltage from the foregoing stage indicating that the stage is in position 1 and a voltage from the foregoing gate indicating that the corresponding AND-condition is fulfilled for this gate. When the AND-condition is fulfilled triggering will occur at the next coming triggering flank from A1.

A differentiating circuit d1, d2, d3 . . . is connected to the output of each stage for producing a short pulse each time the stage is switched to the said position 1. The differentiating circuits d1, d2, d3 also comprise switching means connecting the respective circuit to a common output lead L. None of the pulses derived by the differentiating circuits will coincide in time and upon output lead L therefore will appear all pulses derived from the selected stages. The pulses on output lead L may for example be led to a dividing counter for producing an accurately adjustable frequency at the output of the said dividing counter.

The bistable stages or flip-flops with associated AND-gates may be of a construction as shown in FIG. 2 for stage FF4 with AND-gate G4. The shown flip-flop consists of two transistors T1 and T2 which are interconnected such that the stage can occupy two stable positions with the one or the other of the transistors conducting. The said position 1 is represented by T1 being cut-off and T2 conducting. The left hand transistor T1 is connected to an output terminal 01 through a transistor T3 in emitter follower connection. Upon the terminal 01 will appear a voltage of about 6 v. when the stage is in position 1 and a voltage of about 0 v. when the stage is in position 0. The stage is triggered by means of triggering peaks generated by input differentiating capacitors C1 and C2 which are leading from an input terminal I*n* to the base electrode of the respective transistor. To the input I*n* is led the output voltage from the gate G4. The gate consists of three input diodes D1, D2, D3 with a following transistor T4 in emitter follower connection. The input diodes D1, D2, D3 are connected to the output 01 of the foregoing stage FF3, the output of the foregoing gate G3 and the output of the amplifier A1, respectively. A diode D4 furthermore leads from the output of the gate to the output of the triggering amplifier A1.

As was mentioned, triggering of the stage is initiated by a voltage change corresponding to disappearance of the AND-condition of the gate. The AND-condition of the gate is fulfilled when the gate receives a positive voltage of about 6 v. at all three of its inputs. In this condition the AND-gate delivers a positive voltage of approximately the same magnitude to the input terminal I*n*. When the AND-condition disappears due to a negative voltage jump (triggering flank) in the voltage coming from the triggering amplifier A1 the same voltage jump will appear without delay at the input terminal I*n* due to the presence of diode D4. The capacitors are biased such that each second voltage change at the input terminal I*n* produces switching of the stage to position 1 and each second voltage change produces resetting of the stage to position 0.

The triggering function is illustrated in FIG. 3, where diagrams (a) and (b) show the output voltages from the Schmitt-trigger stage ST and triggering amplifier A1 respectively. The remaining diagram shows the output voltages of the stages FF1–FF4 and gates G2–G4, it being assumed that all stages are in position 0 in moment $t_0$.

Triggering of the stage FF1 is initiated in moments *t*1, *t*2, *t*3 . . . but due to inherent delay of the stage switching and resetting will take place a small time interval later in moments *t*1′, *t*2′, *t*3′, . . . The delay of the stage is designated $\delta$ and is assumed to be the same for all stages. Gate G2 receives input voltages from amplifier A1 and first stage FF1 and delivers output voltage only if input voltages are present on both inputs. At the output of G2 therefore will appear only each second output pulse from amplifier A1 as shown in diagram 3(*d*). The AND-condition of G2 disappears due to near flank in the output voltage from amplifier A1 thus producing a corresponding rear flank in the output voltage from G2 in moments *t*2, *t*4, *t*6 . . . . The output voltage of G2 will disappear in the moment when the output voltage of A1 has decreased so much that the diode D4 (FIG. 2) is made conductive. However as the rear flank in the output voltage from A1 is assumed to be very steep there will be a negligible time delay (not visible in the drawing) between the rear flanks in the output voltages from amplifier A1 and gate G2. Triggering of stage FF2 will therefore be initiated without delay in moments *t*2, *t*4, *t*6 . . . . Due to the inherent delay of the stage switching and resetting will take place after a delay of $\delta$ in moments *t*2′, *t*4′, and *t*6′ . . . . Gate G3 receives input voltages from both amplifier A1, gate G2 and the stage FF2. The AND-condition of G3 will therefore be fulfilled only for each fourth pulse from amplifier A1 as shown in diagram 3(*g*). The AND-condition disappears due to rear flank in the output voltage from amplifier A1 in moments *t*4, *t*8 . . . thus producing a corresponding rear flank in the output voltage from G3. Practically in the same moment also the voltage from G2 disappears but as G2 is controlled from A1 it will always be the flank in the voltage from A1 which determines the flank in the output voltage from G3. Of the same reason as mentioned for G2 there will be a negligible time delay between the rear flanks in the output voltages from A1 and G3. Thus triggering of stage FF3 is initiated in moments *t*4, *t*8 . . . and switching and resetting respectively will occur after a delay of $\delta$ in moments *t*4′, *t*8′, . . . (see diagram 3(*h*)). Gate G4 is controlled from amplifier A1, gate G3 and stage FF3. The AND-condition of G4 is fulfilled for each eighth output pulse from amplifier A1, diagram 3(*i*). The AND-condition of G4 disappears due to rear flank in the output voltage from A1 in moment *t*8. Switching of the stage FF4 is occurring after a time delay of $\delta$ in moment *t*8′ etc.

The maximum delay in triggering action of any stage has according to the above been reduced to the inherent delay $\delta$ of each stage. This has been achieved in first hand by controlling each gate directly from the output of the triggering generator A1, whereby the possible delays of the gates cannot accumulate and furthermore by connecting the triggering generator directly to the output of the gates through a diode D4 thus eliminating the delay of the gates.

What is claimed is:

1. An arrangement for trigering a plurality of successive bistable stages, comprising a source of trigger pulses, means coupling the input of each bistable stage to said source, each of said means coupled to the said stages including a multi-input coincident gate having an input thereof coupled to said source and the output thereof to the bistable stage associated therewith, means connecting the output of each of said successive bistable stages respectively to a further input of the gate coupled to the next successive stage, and means connecting the output of each of said gates respectively to another input of the gate coupled to the next successive stage.

2. The combination of claim 1 where each of said gates consist of a number of diodes, each associated with an input thereof, and a common amplifier coupling said diodes to said output, and further including a further diode coupling said source of trigger pulses directly to the output of each of said gates.

3. In an arrangement for triggering a binary pulse counter having a plurality of successively arranged bistable stages each responding to a change in applied triggering voltage from a first level to a second level to change from a first stable condition to a second stable condition, each stage further responding to a successive change in applied triggering voltage from a first level to a second level to change from said second stable condition back to said first stable condition, the combination comprising a source of trigger pulses repetitively switching between said first and second levels, means applying said trigger pulses to each of said successively arranged bistable stages, each of said means coupled to the said stages including a multi-input AND gate having an input thereof connected to said source and the output thereof connected to said bistable stage associated therewith, each said AND gate delivering a first level output in accordance with a fulfilled AND condition and a second level output in accordance with a non-fulfilled condition, means connecting the output of each of said successively arranged bistable stages respectively to an input of the gate coupled to the next successive stage, and means connecting the output of each of said gates respectively to an input of the gate coupled to the next successive stage, each of said gates responding to a coincidence of inputs of a second stable condition output of a preceding bistable stage, a first level output of a preceding AND gate and a trigger pulse of said first level for establishing a fulfilled AND condition and passing the flank of said trigger pulse when switching from said first to said second level through to the bistable stage associated with AND gate for changing the state of said stage.

4. The combination of claim 3 wherein each of said gates consist of a number of diodes, each associated with an input thereof, and a common amplifier coupling said diodes to said output, and further including a further diode coupling said source of trigger pulses directly to the output of each of said gates.

References Cited

UNITED STATES PATENTS 3,064,890 11/1962 Butler.

MAYNARD R. WILBUR, *Primary Examiner.*

GREGORY J. MAIER, *Assistant Examiner.*

UNITED STATES PATENT OFFICE

CERTIFICATE OF CORRECTION

Patent No. 3,422,254 January 14, 1969

Seth Johan Ronald Lundin

It is certified that error appears in the above identified patent and that said Letters Patent are hereby corrected as shown below:

Column 5, line 2, "trigering" should read -- triggering --. Column 6, line 18, after "with" insert -- said --.

Signed and sealed this 24th day of March 1970.

(SEAL)
Attest:

Edward M. Fletcher, Jr.
Attesting Officer

WILLIAM E. SCHUYLER, JR.
Commissioner of Patents